(12) United States Patent
Zhang et al.

(10) Patent No.: US 8,338,313 B2
(45) Date of Patent: Dec. 25, 2012

(54) METHOD FOR NONDESTRUCTIVE LIFT-OFF OF GAN FROM SAPPHIRE SUBSTRATE UTILIZING A SOLID-STATE LASER

(75) Inventors: Guoyi Zhang, Beijing (CN); Yongjian Sun, Beijing (CN); Xiangning Kang, Beijing (CN); Zhizhong Chen, Beijing (CN); Zhijian Yang, Beijing (CN); Xinrong Yang, Beijing (CN)

(73) Assignee: Sino Nitride Semiconductor Co, Ltd., Dongguan, Guangdong (CN)

( * ) Notice: Subject to any disclaimer, the term of this patent is extended or adjusted under 35 U.S.C. 154(b) by 30 days.

(21) Appl. No.: 12/865,728

(22) PCT Filed: Apr. 21, 2009

(86) PCT No.: PCT/CN2009/000424
§ 371 (c)(1),
(2), (4) Date: Apr. 22, 2011

(87) PCT Pub. No.: WO2010/051677
PCT Pub. Date: May 14, 2010

(65) Prior Publication Data
US 2011/0201191 A1    Aug. 18, 2011

(30) Foreign Application Priority Data

Nov. 7, 2008    (CN) .......................... 2008 1 0225953

(51) Int. Cl.
*H01L 21/31* (2006.01)

(52) U.S. Cl. ....................................................... 438/778
(58) Field of Classification Search .................... 438/778
See application file for complete search history.

(56) References Cited

U.S. PATENT DOCUMENTS

| 2002/0182889 A1* | 12/2002 | Solomon et al. .............. 438/778 |
| 2005/0059179 A1* | 3/2005 | Erchak et al. .................... 438/22 |
| 2006/0189017 A1* | 8/2006 | Nogami ......................... 438/46 |
| 2006/0216955 A1 | 9/2006 | Swenson |
| 2006/0292718 A1 | 12/2006 | Park |
| 2007/0295984 A1* | 12/2007 | Ono et al. ..................... 257/103 |
| 2008/0047940 A1 | 2/2008 | Li |

* cited by examiner

*Primary Examiner* — Charles Garber
*Assistant Examiner* — Andre C Stevenson
(74) *Attorney, Agent, or Firm* — SV Patent Service

(57) ABSTRACT

A method for nondestructive laser lift-off of GaN from sapphire substrates is disclosed. A solid-state laser is used as the laser source. A small laser-spot having a perimeter length of 3 to 1000 micrometers and a distance of two farthest corners or a longest diameter of no more than 400 micrometers is used for laser scanning point-by-point and line-by-line. The energy at the center of the laser-spot is the strongest and is gradually reduced toward the periphery. A nondestructive laser lift-off with a small laser-spot is achieved. The scanning mode of the laser lift-off is improved. Device lift-off can be achieved without the need of aiming. As a result, the laser lift-off process is simplified, and the efficiency is improved while the rejection rate is reduced. The obstacles of the industrialization of the laser lift-off process are removed.

19 Claims, 3 Drawing Sheets

METHOD FOR NONDESTRUCTIVE LIFT-OFF OF GAN FROM SAPPHIRE SUBSTRATE UTILIZING A SOLID-STATE LASER

CROSS-REFERENCE TO RELATED APPLICATIONS

The present application is a national-entry application based on and claims priority to PCT Patent Application PCT/CN2009/000424, entitled "Method for non-destructive lift-off of GaN from sapphire substrate utilizing solid-state laser" by the same inventors, filed Apr. 21, 2009, which claims priority to Chinese Patent Application No. CN200810225953.2, filed Nov. 7, 2008. The content of these applications is incorporated herein by reference.

TECHNICAL FIELD

The present invention relates to methods for preparations of GaN substrates and related devices by laser lift-off, and more specifically, to the application of solid-state lasers to separate GaN devices from their associated substrates. The disclosed methods improve the conventional laser lift off methods, and can achieve separation of GaN device from the related substrate without the need of aiming.

BACKGROUND OF THE INVENTION

In recent years, III/V nitride materials, mainly GaN, InGaN, and AlGaN, have received much attention as semiconductor materials. Thanks to their continuously variable direct band gap from 1.9 to 6.2 eV, excellent physical and chemical stability, and high saturation electron mobility, the III/V nitride materials are the most preferred materials for optoelectronic devices such as laser devices and light-emitting diodes.

Due to the limitation in the growth technologies of GaN, however, large area of GaN materials are mostly grown on sapphire substrates. Although the GaN grown on a sapphire substrate has high quality and wide applications, the GaN based semiconductor devices are largely limited by the non electro-conductivity and poor thermal-conductivity of the sapphires. In order to avoid such disadvantages, methods have been invented to replace the sapphires substrate, after the growth of GaN based devices on sapphires, with high thermal-conductivity and high electro-conductivity materials such as Si, Cu, or the like. A commonly applied method for the removal of sapphire is laser lift-off technology.

The laser lift-off technology involves irradiating the GaN layer through the sapphire substrate at the interface between the sapphire and the GaN layer with a laser source having energy less than the band gap of the sapphire but larger than the band gap of GaN. As a result, the GaN absorbs the laser energy and yields high temperature. The GaN material at the interface is decomposed into gallium and nitrogen gas, which leads to the separation of the GaN layer and the sapphire substrate.

Conventional laser lift-off technologies use large laser-spots (having circumference larger than 1000 micrometers) to scan chip by chip (i.e. die) to achieve lift-off and separation of the GaN based device from the sapphire substrate. Such large laser-spot lift-off technologies include several disadvantages: because of the large fluctuation of energy on the edge of the laser-spot, stress is highly concentrated on the edge, resulting in that GaN at the edge of the laser-spot is seriously damaged, as shown in FIG. 1. The depth of the damage can vary from several tenths of micrometer to several micrometers, which is unavoidable. This disadvantage seriously limits the process for laser lift-off of GaN based devices.

The conventional laser lift-off process includes approximately the following steps:

(1) A GaN based epitaxial wafer is grown on a sapphire substrate;

(2) The epitaxial wafer with the sapphire substrate is made into GaN based separated device cells;

(3) Other thermal—conductive and electro-conductive substrates are electroplated or bonded;

(4) The sapphire substrate is removed by a laser lift-off method.

In the above mentioned process, in order to avoid the large laser-spot edge damage to the GaN based devices (which generally high power devices in dimensions of millimeters and power devices in dimensions of micrometers), the most adopted method directly covers one or more GaN based device cells, and to position the edge of the laser spot in passages between GaN based device cells to avoid laser-spot edge damages as much as possible. The above described also include several drawbacks: (1) the area of the laser spot must be accurately adjusted in accordance with the device size; (2) the position of the laser spot needs to be repeatedly aimed to ensure that the edge of the laser spot lay in the passages between GaN device cells; (3) a real-time video track detection is required to monitor position of the laser spot. When the edges of the laser spot are found to deviate onto the GaN devices, the operation must be immediately stopped for recalibration and correction. The above described issues are major obstacles to the application of laser lift-off technologies in large-scale device manufacturing, can significantly complicate the process and reduce production efficiency, and can increase the failure rate of the device (deviations in laser aiming or laser scanning can aggravate damages at the edge of the laser spot).

SUMMARY OF THE INVENTION

The object of the present invention is to provide nondestructive lift-offs of GaN devices from their associated sapphire substrates using a laser lift-off method without the need of aiming.

DETAILED DESCRIPTION

The technical solution of the present invention is as follows:

A method for laser lift-offs of GaN devices from sapphire substrates is described. The method is characterized by the following: A solid-state laser is used as the laser source. A small laser-spot having a perimeter length of 3 to 1000 micrometers and a distance between two farthest corners or a longest diameter of no more than 400 micrometer is used for laser scanning point-by-point and line-by-line. The energy in the small laser-spot is distributed such that the energy in the center of the laser-spot is the strongest and gradually decreases toward the perimeter of the laser spot.

Figure 1:
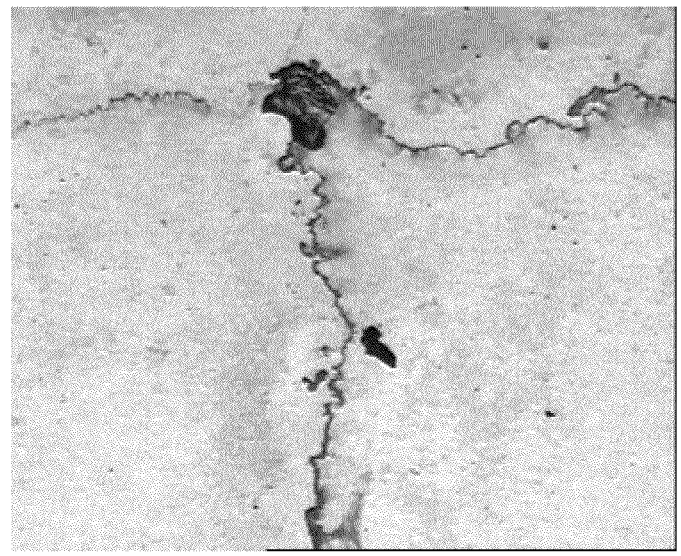
FIG. 1 is a photograph of the damages at the edges of GaN after the lift-off by a large laser spot in conventional techniques.
Figure 2A:
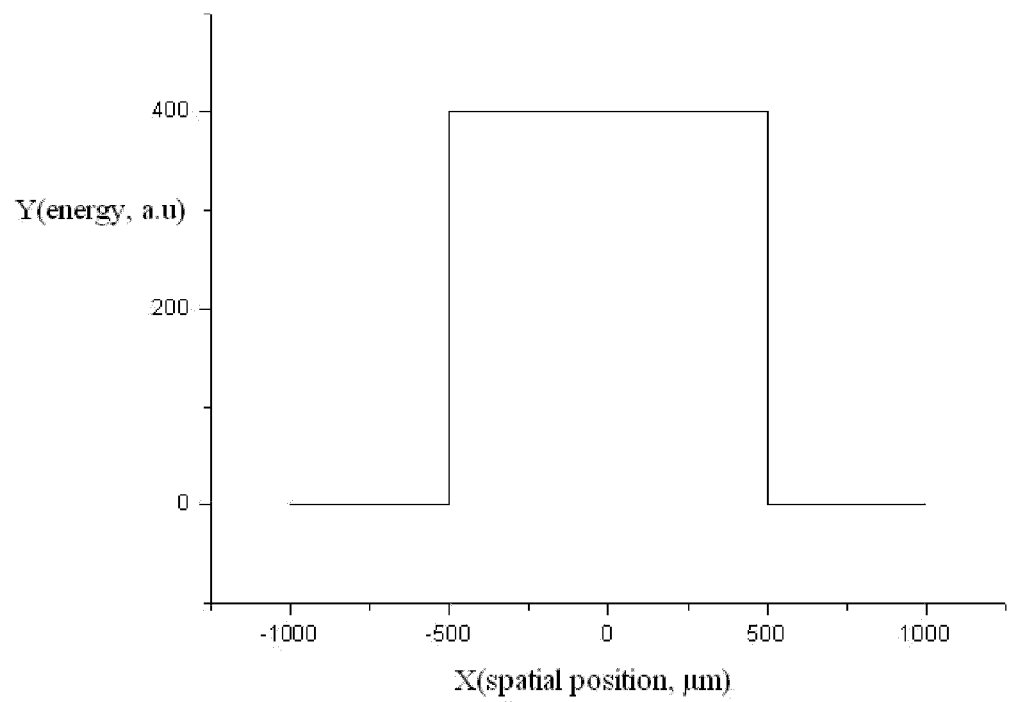
FIG. 2A shows the energy distribution in a laser spot in conventional lift-off techniques.
Figure 2B:
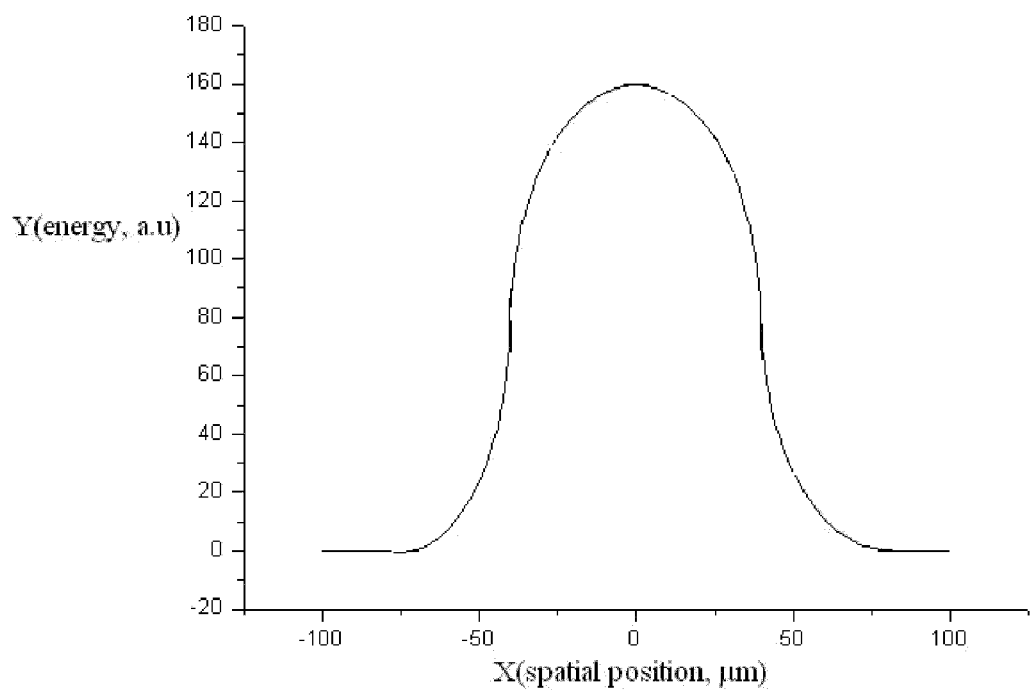
FIG. 2B shows the energy distribution in a small laser spot in the presently disclosed techniques.

According to the present invention, the convention laser lift-off technology using large laser spot is changed by using small laser spot to achieve lift-off of GaN based device from substrate without the need for aiming. The small laser-spot method has not been used historically for the two important reasons: (1) it is generally recognized that an edge problem will be introduced into cells of the GaN based devices by small laser-spot lift-off, so that the quality of laser lift-off will be reduced; (2) nondestructive laser lift-offs by small laser-spots have not yet been realized. A perimeter of the small laser spot used in the present invention has a length between 3 micrometers and 1000 micrometers, and a distance of two farthest corners or a longest diameter is not more than 400 micrometers. Preferably, the perimeter length is 100 to 400 micrometers, and a distance of two farthest corners or a longest diameter is no more than 150 micrometers. The shape of the small laser spot can be square, rectangle, circle, oval, pentagon, hexagon, heptagon or octagon, and so on. Such small laser spots can for example be square laser spots having sides ranging from 1 to 250 micrometers, or circular laser spots having diameters ranging from 1 to 400 micrometers. At the same time, the present invention made adjustments to the laser energy distribution within a single laser spot, which changes the energy fluctuations within the laser-spot. In the conventional techniques, the energy is uniformly distributed in the large laser-spot, but has abrupt changes at the edge of the laser-spot, which easily produces damages to devices. The energy distribution of a pulse laser spot in a conventional technique is shown in FIG. 2a, in which the X-axis represents the distance along the side of the large laser spot. The Y-axis represents the energy scale. The zero position of the X-axis corresponds to the center of the laser-spot. In the present invention, the internal energy distribution condition of the laser-spot is changed. Energy uniformity within the laser spot is no longer pursued. Instead, the energy distribution at the edge of the laser-spot is taken into consideration. The energy distribution of the small laser spot can be as shown in FIG. 2b. Compared to the large laser-spot, it is easier to achieve a gradual change of laser energy of the small laser spot. The emphasis on the energy gradual transition (gradually changed from a stronger energy section close to the center of the laser-spot to a weaker energy section far from the center) in the edge section of the small laser spot improves the stress condition of the GaN based material at the edge of the laser-spot, thereby realizing a nondestructive laser lift-off by small laser-spot.

The solid-state laser used in the present invention can be an improved solid-state harmonic frequency laser source. The laser fluctuations inside the laser spot are improved by that the energy is the highest in the center of the laser-spot and is gradually reduced toward the periphery. The internal energy throughout the laser-spot can be distributed in a Gauss distribution or approximately distributed in a Gauss distribution.

Figure 3:
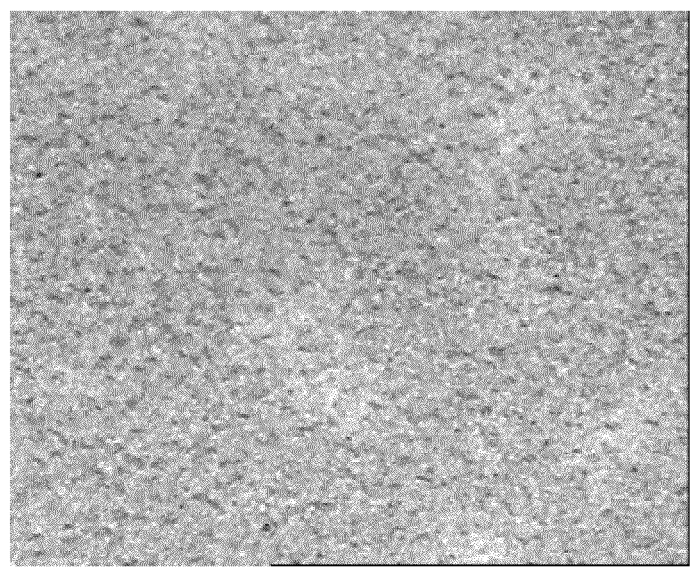
FIG. 3 is a photograph of the surface of a device after laser lift-off using a small laser spot in according to the present invention.

According to the present invention, a nondestructive lift-off by small laser-spot is achieved (lift-off surface as shown in FIG. 3, without apparent damage), thereby achieving a lift off without aiming. According to the method of the present invention, the laser lift-off scanning mode is improved. After a step of electroplating or bonding by traditional processes, the adjustment of laser-spot area according to the GaN device cell size is no longer needed. Aiming of the laser spot before scanning is no longer necessary. The laser scanning can be directly carried out without pauses or real time detections.

In comparison with prior arts, the advantageous effects of the present invention are: First, the laser lift-off process is drastically simplified; Second, the operating efficiency of laser lift-off is largely improved; Thirdly, the rejection rate is reduced; Fourthly, obstacles to applying laser lift-off in manufacturing are removed, which advances the laser lift off in manufacturing processes.

Detailed Implementation Methods

The present invention is further described in details by examples in conjunction with figures, but not in any way limiting the present invention.

Example 1

A vertical structure of a GaN based device is made by laser lift-off according to the following steps:

(1) A GaN based epitaxial wafer is grown on a sapphire substrate, and further fabricated into GaN based separated device cells. Then a Cu layer is bonded on the GaN surface by Pd/In bonding method, wherein Pd is plated by sputtering to 200 nm, and In is evaporated by thermal evaporation to 600 nm. Then the Cu layer plated with Pd/In metal and the GaN wafer are bonded at a high temperature of 200° C. and a high pressure of 1 MPa, for 20 minutes;

(2) The bonded specimen is lifted off using an improved solid-state harmonic frequency laser source (e.g. YAG laser source), having a laser energy density of 600 mj/cm$^2$, a laser frequency of 20 Hz, a laser-spot approximately in square shape with a side about 30 micrometers, and a distance of 30 micrometers between the centers of the adjacent laser spots. The laser spot is scanned point-by-point and line-by-line scanning across the sapphire surface of the specimen.

Figure 4:
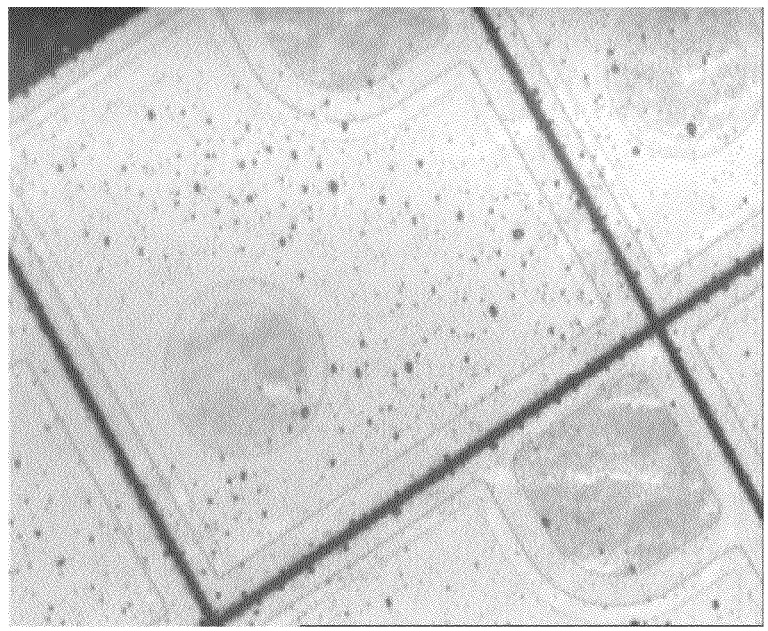
FIG. 4 is a microscopic photograph at 500 magnification of a device surface after laser lift-off in a first example in according to the present invention.

After the lift-off, the sapphire substrate is removed. The lift-off result is shown as FIG. 4, which shows, at a 500 times magnification, that the lift-off surface of the device is uniform free of damages.

Example 2

A vertical structure of a GaN based device is lifted off according to the following steps:

(1) A GaN based epitaxial wafer is grown on a sapphire substrate, and further fabricated into GaN based separated device cells. Then a Cu layer is bonded on the GaN surface by Pd/In bonding method, wherein Pd is plated by sputtering to 200 nm, and In is evaporated by thermal evaporation to 600 nm. Then the Cu layer plated with Pd/In metal and the GaN wafer are bonded at a high temperature of 200° C. and a high pressure of 1 MPa, for 20 minutes;

(2) The bonded specimen is lifted off using an improved solid-state harmonic frequency laser source (e.g. YAG laser source), having a laser energy density of 600 mj/cm$^2$, a laser frequency of 20 Hz, a laser-spot approximately in square shape with a side about 100 micrometers, and a distance of 100 micrometers between the centers of adjacent laser spots. The laser spot is scanned point-by-point and line-by-line scanning across the sapphire surface of the specimen.

Figure 5:
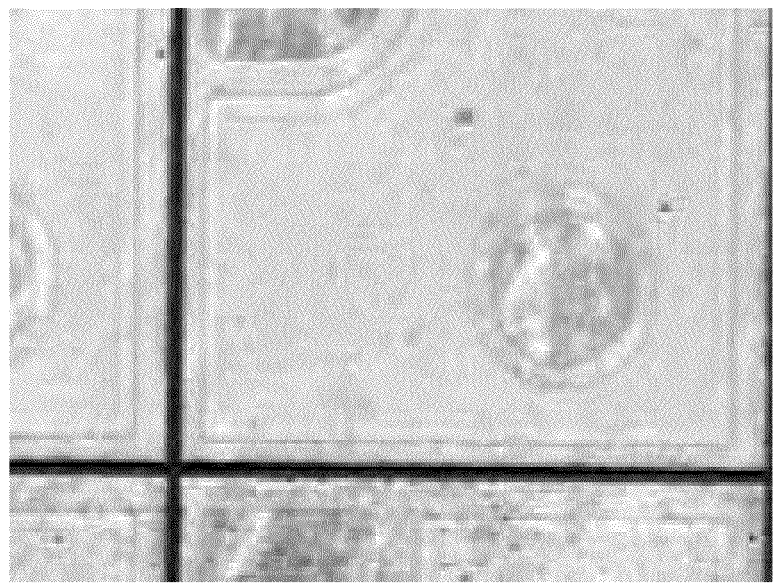
FIG. 5 is a microscopic photograph at 500 magnification of a device surface after laser lift-off in a second example in according to the present invention.

After the lift-off, the sapphire substrate is removed. The lift-off result is shown as FIG. 5, which shows, at a 500 times magnification, that the lift-off surface of the device is uniform free of damages.

What is claimed is:

1. A method for non-destructively lifting a III-V semiconductor device from a sapphire substrate, comprising:
    obtaining a III-V semiconductor layer grown on a sapphire substrate at an interface;
    irradiating a laser beam through the sapphire substrate, wherein the laser beam forms a laser spot at the interface between the III-V semiconductor layer and the sapphire substrate, wherein the laser spot has a distance between two farthest corners or a longest diameter smaller than 400 µm; and
    scanning the laser beam across the interface between the III-V semiconductor layer and the sapphire substrate to form a plurality of laser spots at the interface to non-destructively separate the III-V semiconductor layer from the sapphire substrate, wherein the distance between the centers of adjacent laser spots at the interface is in a range of about 30 µm and about 100 µm.

2. The method of claim 1, wherein the perimeter of the laser spot has a distance between two farthest corners or a longest diameter no more than 150 micrometers.

3. The method of claim 1, wherein the perimeter of the laser spot has a length between about 3 µm and 1000 µm.

4. The method of claim 1, wherein the perimeter of the laser spot has a length between about 100 µm and 400 µm.

5. The method of claim 1, wherein the laser spot at the interface has a width of about 30 microns µm.

6. The method of claim 1, wherein the laser spot at the interface has a width of about 100 microns µm.

7. The method of claim 1, wherein the distance between the centers of adjacent laser spots is about the same as the width of the laser spot.

8. The method of claim 1, wherein the laser spot at the interface has a shape selected from the group consisting of a square, a rectangle, a polygon, a circle, and an elliptical.

9. The method of claim 1, wherein the laser spot has a substantially Gaussian energy distribution at the interface between the III-V semiconductor layer and the sapphire substrate.

10. The method of claim 1, wherein the laser beam is emitted by a solid-state laser device.

11. The method of claim 1, further comprising:
    bonding a conductive layer on a surface of the III-V semiconductor layer opposing the interface between the III-V semiconductor layer and the sapphire substrate.

12. The method of claim 11, wherein the conductive layer comprises copper, the method further comprising:
    depositing a palladium layer on the surface III-V semiconductor layer;
    depositing an Indium layer on the palladium layer; and
    bonding the conductive layer to the indium layer.

13. The method of claim 12, wherein the palladium layer is deposited on the surface III-V semiconductor layer by sputtering, wherein the Indium layer is deposited on the palladium layer by thermal evaporation.

14. The method of claim 1, wherein the III-V semiconductor material comprises GaN.

15. The method of claim 1, wherein the III-V semiconductor material comprises a nitride material.

16. A method for non-destructively lifting a III-V semiconductor device from a sapphire substrate, comprising:
    obtaining a III-V semiconductor layer grown on a sapphire substrate at an interface;
    irradiating a laser beam through the sapphire substrate, wherein the laser beam forms a laser spot at the interface between the III-V semiconductor layer and the sapphire substrate, wherein the perimeter of the laser spot has a length between about 3 µm and 1000 µm; and
    scanning the laser beam across the interface between the III-V semiconductor layer and the sapphire substrate to form a plurality of laser spots at the interface to non-destructively separate the III-V semiconductor layer from the sapphire substrate, wherein the distance between the centers of adjacent laser spots at the interface is in a range of about 30 µm and about 100 µm.

17. The method of claim 16, wherein the perimeter of the laser spot has a length between about 100 µm and 400 µm.

18. The method of claim 16, wherein the laser spot has a distance between two farthest corners or a longest diameter smaller than 400 µm.

19. The method of claim 16, wherein the laser beam is emitted by a solid-state laser device.

* * * * *